(12) United States Patent
Kurshan

(10) Patent No.: US 6,708,143 B1
(45) Date of Patent: Mar. 16, 2004

(54) VERIFICATION COVERAGE METHOD

(75) Inventor: Robert Paul Kurshan, New York, NY (US) 10014

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/575,383

(22) Filed: May 22, 2000

(51) Int. Cl.$^7$ ............................................. G06F 17/50
(52) U.S. Cl. ............................ 703/2; 703/13; 703/22; 716/5; 714/33
(58) Field of Search .......................... 703/22, 2, 13; 716/5, 6, 2; 714/33, 37

(56) References Cited

U.S. PATENT DOCUMENTS

| | | | |
|---|---|---|---|
| 5,163,016 A | * 11/1992 | Har'El et al. | 716/5 |
| 5,691,925 A | 11/1997 | Hardin et al. | |
| 5,901,073 A | * 5/1999 | Kurshan et al. | 703/6 |
| 5,926,622 A | 7/1999 | Hardin et al. | |
| 5,946,481 A | * 8/1999 | Kurshan et al. | 703/13 |
| 6,102,959 A | * 8/2000 | Hardin et al. | 703/2 |
| 6,185,516 B1 | * 2/2001 | Hardin et al. | 703/2 |

OTHER PUBLICATIONS

Caughlin, "Verification, Validation, and Accreditation (VV&A) of Models and Simulations through Reduced Order Metamodels", Proceedings of the 27th Conference on Winter Simulation, Dec. 1995, pp. 1405–1412.*

Clarke et al., "Formal Methods: State of the Art and Future Directions", ACM Computing Surveys, vol. 28, No. 4, 1996, pp. 626–643.5163016.*

* cited by examiner

Primary Examiner—W. D. Thomson

(57) ABSTRACT

In testing a system, coverage of the testing is obtained by maintaining a store of information that is populated as the testing progresses. The store maintains information about the ranges of system variables that are employed during the testing. At the conclusion of the testing, the coverage of the testing is reported out, to permit the designer to assess whether other queries ought to be formulated, or whether portions of the system are superfluous. The testing can employ simulations, formal verifications, or some other techniques.

4 Claims, 1 Drawing Sheet

VERIFICATION COVERAGE METHOD

BACKGROUND OF THE INVENTION

This invention relates to system verification, and more particularly to a method for ascertaining coverage obtained from a given collection of queries.

An ongoing problem in the design of large systems is verifying that the system will indeed behave in the manner intended by its designers. One approach has been to simply try out the system, either by building and testing the system itself or by building and testing a model of the system. Another approach is to test a software model of the system through simulations that test the functionality and/or properties of the system.

In testing a system design artisans classically create a model of the hardware or the software system being tested, and run the model through a number of simulations, where each simulation focuses on a functional aspect (property) of the hardware or software design. Since a single simulation is rarely sufficient to test a given property, a number of related simulations are executed for each functional aspect of the design to determine whether the property is correctly implemented in the hardware or software. Together, the group of related simulations is called a test suite.

Running a test suite can be a time consuming and costly process, requiring set-up, running the simulations, and evaluating the results. Moreover, it is quite possible that a test run would result in an error condition, indicating that the system model does not perform as desired. Such a condition calls for a modification of the system design and a repeat run of the tests.

Another method for testing a hardware and/or software design is formal verification. In formal verification, the designer provides to a formal verification system a logical definition of the intended behavior of the design or system, and a logical definition of the implementation of the system. The formal verification system then determines whether the logical definition of the implementation implies the logical definition of the system's intended behavior. That is, the formal verification system determines whether the implementation can perform the functions or tasks it is intended to perform, as defined by the system specification.

In U.S. Pat. No. 5,691,925, issued Nov. 25, 1997, an efficient method is disclosed where a system design is verified by forming a reduced model with respect to a tested property of the system, and running a verification operation on the reduced model. This localization reduction consists of eliminating some program variables, and decreasing the range of other program variables. This reduction is conservative, in the sense that it guarantees that a property will hold in the unreduced model if it holds in the reduced model. Performing the verification operation on the reduced model is quicker, and a verification that a query is satisfied in the reduced model extends to the unreduced system.

At some point in the course of testing properties it may be determined that a property is not satisfied, requiring a modification to the system's model. This raises the issue of whether properties that had been verified need to be verified again, for the modified system. The decision whether verification of a property needs to be undertaken following a modification to the system may be reached by saving a checksum with each localization reduction and, then, after the model has changed, recompute the checksum for the localization reductions. If a checksum of a localization reduction with respect to a particular property after the system model is modified matches the checksum of the localization reduction with respect to that property in the unmodified system model, one can conclude that property need not be verified for the modified model. This technique is described by Hardin et al in "Efficient Regression Verification," IEE Proc. WODES'96, 1996, pp. 147–150.

Although the methods described above are very beneficial, it still remains that the set of queries that are used to verify the system might not be sufficient to verify the entirety of the system. There may be variables of the system that have not been exercised and values of variables that have not been employed. Knowledge about coverage may lead to the creation of additional queries to be tested, or it may lead to a conclusion that some system portions are unnecessary to the system's functionality.

SUMMARY OF THE INVENTION

An advance in the art is realized with respect to the coverage issue by verifying the system design in accordance with any of the above teachings, and maintaining a store of variables employed and the ranges of the employed variables. In one illustrative embodiment, for example, a given a system model is verified by verifying one property at a time. With respect to each verification, the system model is reduced to form a reduced model, by eliminating all variables having no effect on the property being verified, leaving only those variables and ranges of those variable upon which the given property has a dependence. As the model is verified with respect to each property, the variables and their ranges that are employed in the verifications are collected and, at the conclusion of the verifications, a report is generated for the designer that identifies variables and ranges of variables that have not been employed in verifying any of the properties. If the coverage is less than complete, the designer can assess whether other queries ought to be formulated, or whether portions of the system are superfluous.

BRIEF DESCRIPTION OF THE DRAWING

The presented FIGURE shows a flow chart of a process in accord with the principles disclosed herein.

DETAILED DESCRIPTION

Figure 1:
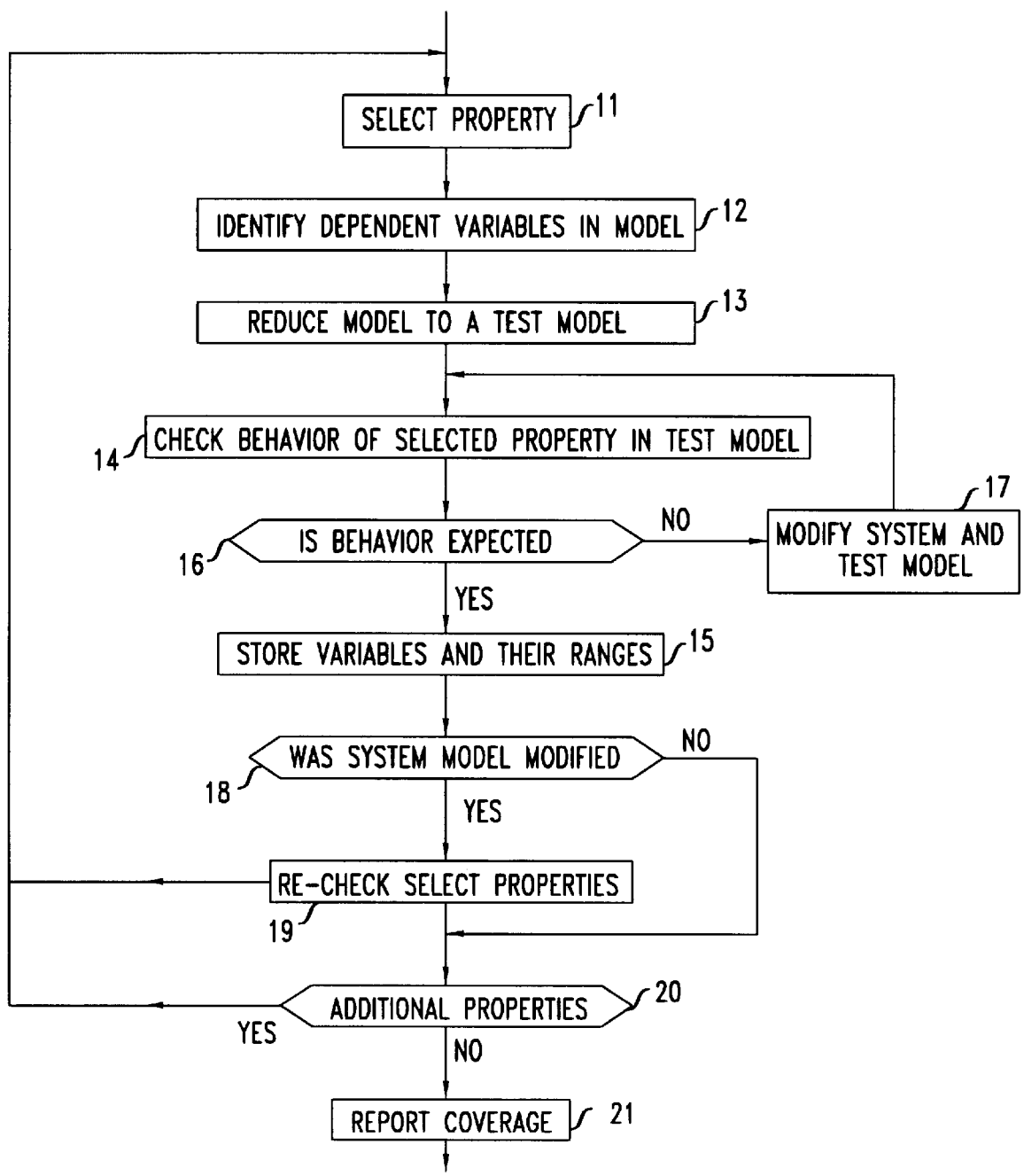

Given a system to be verified, for example, a design of a complex integrated circuit, a set of system variables $x_i$ is associated with the system, and each variable is viable within a given range; i.e., $x_i:R_i$. To test the system's design, the designer creates a suite of queries, $Q_1, Q_2, Q_3, \ldots Q_m$ that test properties subject to constraints of the system. In order to check the system for a given $Q_i$, the system is reduced with respect to $Q_i$, using the teachings disclosed in the '925 patent, and the variables that are exercised in query $Q_i$, and the ranges of those variables are recognized and stored. At the completion of the m query verifications, the stored information is collected and a report is provided to the person performing the test, enabling a determination as to whether any variables were missed, and whether any values of variables were missed. That provides a measure of the coverage provided by queries $Q_1$ through $Q_m$. If the coverage is less than complete, the designer can evaluate whether other queries ought to be formulated, or whether portions of the system are superfluous.

The FIGURE shows a block diagram of an illustrative embodiment of a method for verifying a system model and obtaining a measure of the coverage of the verification. As shown, the method begins at step 11 with the selection of a property of a system model that the system is designed to possess. Once the property is selected, the dependent variables in the models are identified in step 12, and the system model is reduced in step 13 with respect to the selected property in accordance with the teachings in U.S. Pat. No. 5,691,925. Control then passes to step 14, where an attempt is made to verify that the reduced model possess the selected property.

If, at step 16, it is determined that the behavior of the test model is not the behavior that is expected for the selected property, then at step 17 the system model is adjusted and, correspondingly, the reduced model is adjusted, and control returns to step 14. When the behavior of the reduced model is as expected of the system, step 15 stores the variables and their ranges that were employed in step 14, and control passes to step 18, which determines whether the system model was adjusted in step 17 (i.e. whether the method looped through step 17 at least once). The storage forms a base for determining what ranges of the system variables that the suite of queries subsumes. The determination at step 18 is made in light of the possibility that a previously verified property may need to be verified again (pursuant to actions of step 19, described below) the ranges of system variables that are employed in each test (the range of a system variable that is not employed in a test is null) are maintained in memory without commingling. When step 18 determines that the model was not modified, control passes to step 20, which determines whether there are other properties that need to be checked. If so, control returns to step 11.

When step 18 determines that the system model had been changed through operation of step 17, control passes to step 19, where the behavior of all previously-verified properties are verified again, as necessary, before passing control to step 20 when the previously verified properties need not be re-verified, or to step 11 otherwise. The properties selected for re-checking in step 19 are only those previously checked properties that have variables and/or input-output relationships that are affected by the modification effected in step 17 to the system model. These properties can be identified in accordance with the aforementioned checksum approach.

Lastly, when step 20 determines that there are no more properties to be verified, control passes to step 21, which reports-out the coverage of the collection of verified properties, pursuant to the information stored in memory by step 15. The reporting-out is, effectively, an inclusive OR operation that combines the ranges of the system variables that were employed in the entire suite of queries.

The steps described above and shown in the FIGURE can be performed in any manner and/or by any means desired by those skilled in the art. An actual apparatus for performing the verifications, and reporting the coverage can have many different realizations that skilled artisans can envision. It is expected, however, that most realizations will be stored program computer based, under control of appropriate software.

In operation, the user enters a system model into the memory of the computer through conventional interface means, such as a disk, and then initiates a verification and coverage reporting program that follows the principles disclosed herein.

While the invention has been particularly described, it will be recognized by those skilled in the art that modifications and changes may be made to the present invention without departing from the spirit and scope thereof. For example, the principles of this invention apply to any form of testing, or verification, of the design of hardware or software systems. This includes, by way of example, and not by way of limitation, simulations, theorem checking, as well as formal verification.

What is claimed is:

1. A method carried out in a computer, for verifying a system having a set of properties, and a given set of variables, where each variable in said set of variables has a permissible range of values, comprising the steps of:

selecting from said set of properties a property that needs to be verified, performing a verification operation with respect to said property selected in said step of selecting;

ascertaining ranges of values employed in connection with variables from said set of variables that are employed in said step of performing a verification operation and storing said ranges in a memory, not commingled with ranges stored in connection with other verified properties;

returning to said step of selecting, as long as there are properties in said set of properties that need to be verified; and when there are no properties in said set of properties that need to be verified, reporting-out on ranges of said variables that are n employed in said steps of performing a verification operation.

2. The method of claim 1 further comprising a step of gathering said ranges of values employed in connection with each of said variables, as ascertained in said step of ascertaining, in a variable-ranges memory.

3. The method of claim 1 wherein said step of performing a verification operation comprises formal verification operations.

4. A method carried out in a computer, for verifying design of a system having a set of properties, and a given set of variables, where each variable in said set of variables has a permissible range of values, where said verifying of the system is carried out by verifying each property, and where verifying a property is carried out by reducing a specification of said system design with respect to said property by eliminating values from said ranges of values of said variables, up to and including completely eliminating one or more of said variables, forming thereby a reduced system, and performing the verification on the reduced system design relative to a model of said system, the improvement comprising:

selecting from said set of properties a property that needs to be verified, performing a verification operation with respect to said property selected in said step of selecting;

when said verification operation concludes that the property is not verified, creating a modified system design and system model, and returning to said step of performing;

when said verification operation concludes that the property is verified, storing ranges of values employed in connection with variables from said set of variables that are employed in said step of performing, not commingled with stored ranges of values pertaining to other properties, and determining whether previously verified properties need to be re-verified;

when said determining concludes that previously verified properties need to be reverified, returning to said step of selecting;

when said determining concludes that previously verified properties need not be re-verified, returning to said step of selecting, but only as long as there are properties in said set of properties that need to be verified; and when there are no properties in said set of properties that need to be verified, reporting-out on ranges of said variables that are employed in said steps of verification operation.

\* \* \* \* \*